United States Patent [19]
Suzuki et al.

[11] Patent Number: 5,732,096
[45] Date of Patent: Mar. 24, 1998

[54] CONTROL CIRCUIT FOR SUPPLYING A DRIVING CURRENT TO A LASER DIODE

[75] Inventors: Kazuhiro Suzuki; Hiroshi Kuzukami; Yuji Miyaki; Akihiko Yasuda, all of Yokohama; Yoshinori Ohkuma, Kawasaki, all of Japan

[73] Assignee: Fujitsu Limited, Kawasaki, Japan

[21] Appl. No.: 655,813

[22] Filed: May 31, 1996

[30] Foreign Application Priority Data

Nov. 16, 1995 [JP] Japan .................... 7-298093

[51] Int. Cl.$^6$ ...................... H01S 3/00
[52] U.S. Cl. ...................... 372/38
[58] Field of Search ...................... 372/26, 38

[56] References Cited

U.S. PATENT DOCUMENTS

| | | | |
|---|---|---|---|
| 5,253,267 | 10/1993 | Johnson | 372/38 |
| 5,394,416 | 2/1995 | Ries | 372/38 |
| 5,408,485 | 4/1995 | Ries | 372/38 |

FOREIGN PATENT DOCUMENTS

| | | |
|---|---|---|
| 60-18982 | 1/1985 | Japan . |
| 6-152028 | 1/1992 | Japan . |
| 6-85362 | 3/1994 | Japan . |
| 6-169125 | 6/1994 | Japan . |

Primary Examiner—Rodney B. Bovernick
Assistant Examiner—Robert E. Wise
Attorney, Agent, or Firm—Staas & Halsey

[57] ABSTRACT

The control circuit for supplying a driving current to a laser diode makes it possible to keep the laser driving current variable in a wide range. The control circuit includes a laser diode, a photo diode for receiving a part of an optical output emitted from the laser diode and outputting an electrical signal corresponding to a level of the optical output, a first current supplying circuit for supplying a bias current to the laser diode, a first monitor circuit for monitoring a size of a signal driving current supplied by the first current supplying circuit, a second monitor circuit for monitoring a size of the bias current supplied by the second current supplying circuit, a first feed-back loop for controlling the signal driving current supplied from the first current supplying circuit by the output of the first monitor circuit, as a reference of the electric signal outputted from the photo diode corresponding to the level of the optical output emitted from the laser diode, a second feed-back loop for controlling the bias current supplied from the second current supplying circuit by the output of the second monitor circuit, as said reference of the signal outputted from the photo diode corresponding to the level of the optical output emitted form the laser diode; and an adder circuit for adding an offset current of the signal driving current supplied from the first current supplying circuit on the outside of the first feed-back loop.

6 Claims, 16 Drawing Sheets

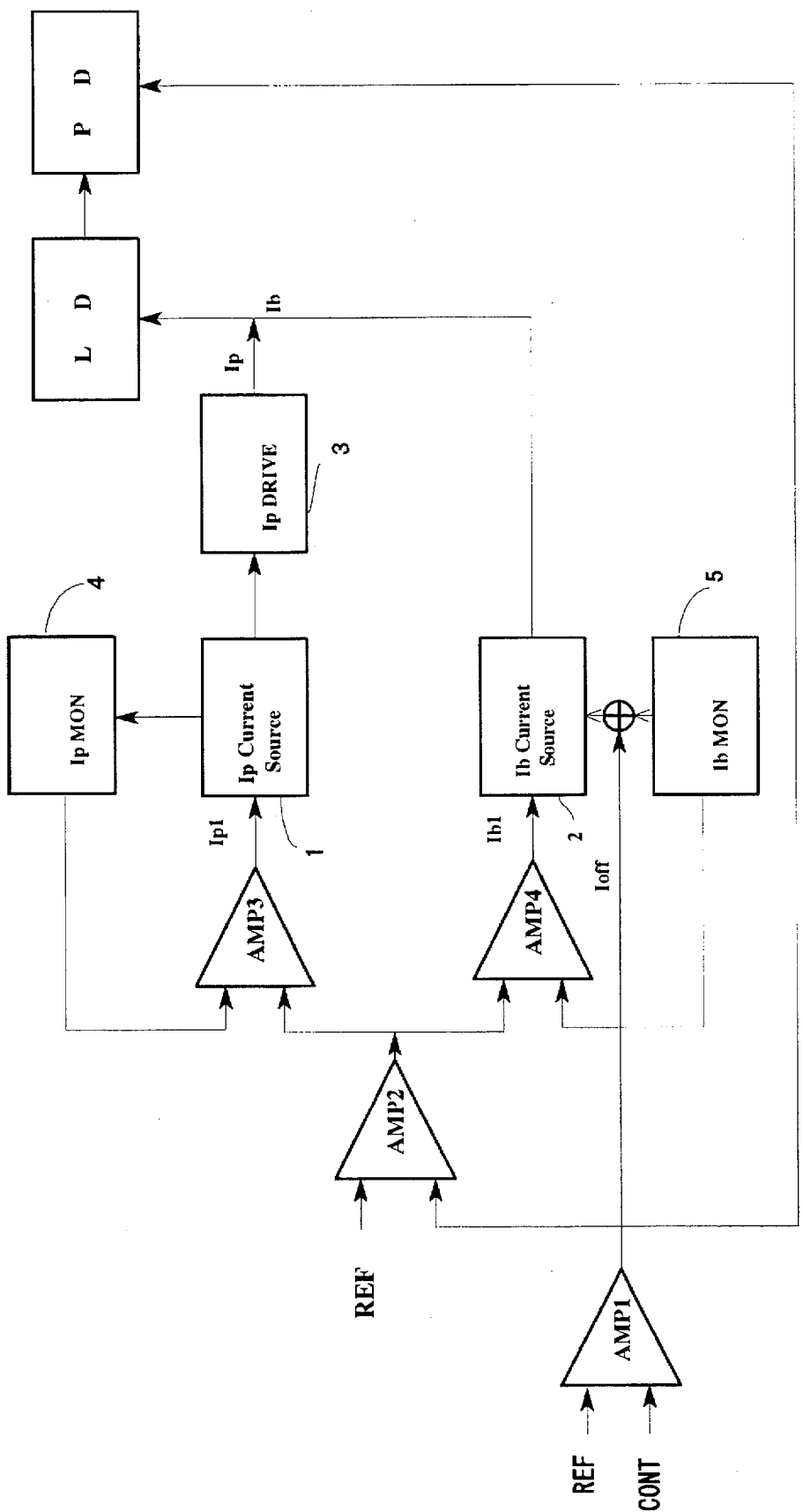
F I G. 12

CONTROL CIRCUIT FOR SUPPLYING A DRIVING CURRENT TO A LASER DIODE

BACKGROUND OF THE INVENTION

Field of the Invention

The present invention relates to a control circuit, for supplying a laser diode current, which is employed in an optical signal transmitter, or the like, and which controls to supply a driving current to a laser diode (LD) so as to emit an optical output with an input signals.

In recent years, more particularly, in a communication file, a demand for performing a transmission between terminals located over long distance with a large capacity has been increased, because optical digital transmission systems have been widely used. Further, an optical signal transmitter with compact size and low power consumption has been also requested in order to realize a wide frequency-band transmission system as a typical of multi-media transmission system.

A control circuit for supplying a driving current to a laser diode in an optical signal transmitter has a Peltier element built in, which may maintain temperature of the laser diode constant, to keep high control accuracy.

However, a device, which an control LD current without employing Peltier elements, has been required for the above-described demand of miniaturization, low-consumptive power, and more particularly, a demand for reducing the cost of the device.

Further, a demand for making it variable to expand environmental temperature range in an optical signal transmitter, i.e., a usage temperature range, to approximately twice as much as that in a conventional temperature. Therefore, a variable range in a driving current for a laser diode is necessary to expand to approximately 20 times, as compared with the conventional device.

FIG. 13 shows an example of control circuits, which a group including the applicant has developed and which are used to supply a driving current to a laser diode. In FIG. 13, LD is a laser diode, and PD is a photo diode, which monitors an optical output emitted from the laser diode LD.

A driving current supplied to a laser diode LD can be obtained by adding a signal driving current Ip and the bias current Ib. The current through the photo diode PD is fed back to control the signal driving current Ip and the bias current Ib to make optical output from the laser diode be constant.

An optical output characteristic of the laser diode LD will be considered according to FIGS. 15A and 15B. In FIGS. 15A and 15B, bias driving current Ib1 and a signal driving current Ip1 are required to obtain a predetermined optical output P0 according to an optical output characteristic I on temperature T1.

On this condition, when temperature T1 moves to T2, the optical output characteristic I is shifted to a differential optical output characteristic II according to a characteristic of the laser diode LD. Then, bias current Ib2 and signal driving current Ip2 are required to obtain the same predetermined optical output P0.

A relationship between the bias current Ib and the signal driving current Ib can be expressed by a line shown in FIG. 15B, as employing temperature as a parameter. The line is also expressed by the following equation (1).

$$Ip = \alpha \cdot Ib + Ioff \qquad (1)$$

$$\alpha = \frac{Ip2 - Ip1}{Ib2 - Ib1}$$

Accordingly, a circuit shown in FIG. 13 is controlled so as to fulfill the relation expressed in the equation (1). The signal driving current Ip is obtained by summing a current Ip1 and the offset current Ioff.

The current Ip1 is fed back to the photo diode PD according to the current flowing therethrough. A differential amplifier AMP1 having a current source driver circuit gives the offset current Ioff as a fixed value. For better understanding, the circuit shown in FIG. 13 will be explained in accompanying with a functional block diagram shown in FIG. 14.

The signal current source 1 shown in FIG. 14 is a position of a mirrored circuit formed of transistors Q10 and Q7 and resistors R1 and R2. The output current Ip1 of a differential amplifier AMP5 having a current source driver circuit is added to the offset current Ioff to supply to the transistor Q10 and the resistor R1. The signal source 1 is formed of a mirrored circuit, so that current flowing through the transistor Q7 and the resistor R2 is proportioned to a current supplied to the transistor Q10 and the resistor R1.

Meanwhile, the bias current source 2 shown in FIG. 14 is formed of a mirrored circuit including transistors Q8 and Q9, resistors R3 and R4. The output current Ib1 of a differential amplifier AMP4 is supplied to a transistor Q9 and the resistor R2. Since the bias current source 2 is formed of a mirrored circuit, a current flowing to the transistor Q8 and the resistor R3, i.e., the bias current Ib, is proportioned to a current supplied to the transistor Q9 and the resistor R4.

In FIG. 13, the signal driving current circuit 3 shown in FIG. 14 is formed of a pair of differential transistors Q5 and Q6.

Further, in FIG. 13, the Ip monitor circuit 4 is a circuit composed of a mirrored circuit including the transistor Q15 and the resistor R5, and a monitor resistor Rp, which is connected to the mirrored circuit in series. The monitor voltage IPM generated in the resistor Rp and the monitor voltage IbM generated in the resistor Rb are fed back respectively to differential amplifiers AMP5 AND AMP4, each of which has a current source driver current.

It is apparent from FIG. 14 that the offset current Ioff is provided within a feed-back loop of the monitor voltage IPM in a circuit shown in FIG. 13. In this case, as shown in FIG. 16A, a real Ip-Ib characteristic becomes the characteristic II. That is, the characteristic II is different from the targeted characteristic I shown in FIG. 15B.

Returning back to the explanation of the circuit shown in FIG. 13, it is controlled that the voltage generated at the monitor resistor RP be equal to that generated in the monitor resistor Rb. If the equal voltage is Va, the relation shown in the equation (2) can be established.

$$Va = Rp \times (Ioff + Ip1), \quad Va'1 = Rb \times Ib0 \qquad (2)$$

Accordingly, when considering a point C in FIG. 16A, the point C is in the case of Ip1=0, the voltage Va fulfills a relationship of the voltage Va' as shown in the equation (3). Further, the bias current Ib0 becomes as shown in the equation (4).

$$Va' = Rp \times Ioff, \quad Va'1 = Rb \times Ib0 \qquad (3)$$

$$Ib0 = \frac{Va'}{Rb} = \frac{Rp}{Rb} \times Ioff \qquad (4)$$

As described above, the bias current Ib0 becomes the above-described value. This is because the offset current Ioff is always constant regardless of increasing and decreasing of Ip1 according to the APC loop, and the monitor voltage V does not become the voltage smaller than the voltage Va'.

According to the real characteristic II shown in FIG. 16A, for example, the point A of the characteristic I is corresponding to the point B of the characteristic II because of temperature conversion.

In this case, when the output power P10 in the laser diode LD is controlled to be constant, as shown in FIG. 16B, the bias current becomes Ib1', which is smaller than Ip1. Therefore, an extinction ratio defined by the following equation (5), i.e., a ratio of a light-emission amount when a predetermined optical power is outputted to a light-emission amount, when the signal driving current is 0, is deteriorated.

$$\text{EXTINCTION RATIO} = \frac{Ip + (Ib - Ith)}{Ib - Ith} \qquad (5)$$

SUMMARY OF THE INVENTION

Accordingly, it is an object of the present invention to provide a control circuit for supplying a driving current to a laser diode, to keep a wide variable range in the laser driving current and a high control accuracy.

It is another object of the present invention to provide a control circuit for supplying a driving current to a laser diode, which has an improvement in a control circuitry group for controlling the offset current Ioff of the LD current.

It is further object of the present invention to provide a control circuit for supplying a driving current to a laser diode, which can prevent from deterioration of an extinction ratio by improving the control circuitry group for controlling the above-described offset current Ioff of the LD current.

Further, other objects of the present invention become clearly by the description for explaining embodiments according to the attached drawings.

A control circuit for supplying a driving current to a laser diode to accomplish the foregoing objects of the present invention may include;

a laser diode, a photo diode for receiving a part of an optical output emitted from the laser diode and outputting an electric signal corresponding to a level of the optical output, a first current supplying circuit for supplying a signal driving current to the laser diode, a second current supplying circuit for supplying a bias current to the laser diode, a first monitor circuit for monitoring a size of the signal driving current supplied by the first current supplying circuit, a second monitor circuit for monitoring a size of the bias current supplied by the second current supplying circuit, a first feed-back loop for controlling the signal driving current supplied from the first current supplying circuit by the output of the first monitor circuit, as a reference of the electrical signal outputted from the photo diode corresponding to the level of the optical output emitted from the laser diode, a second feed-back loop for controlling the bias current supplied from the second current supplying circuit by the output of the second monitor circuit, as said reference of the signal outputted from the photo diode corresponding to the level of the optical output emitted from the laser diode; and an adder circuit for adding an offset current supplying circuit on the outside of the first feed-back loop.

In a specific example, instead of having an adder circuit, which adds an offset current to the signal driving current supplied from the first current supplying circuit on the outside of the first feed-back loop, an adder is provided to add an offset current to the bias current supplied from the second current supplying circuit on the outside of the second feed-back loop.

In another example, an offset current monitor circuit is provided to monitor the offset current, and a monitored output from the offset current monitor circuit is fed-back to the adder circuit.

Furthermore, in other example, an adder circuit is provided to add the offset current to the output of the first monitor circuit in the first feed-back loop.

In still other example, a subtract circuit is provided to subtract the offset current from the output of the second monitor circuit in the second feed-back loop.

BRIEF DESCRIPTION OF THE DRAWINGS

FIG. 12 shows a functional block diagram corresponding to FIG. 11.

DESCRIPTION OF THE PREFERRED EMBODIMENTS

Figure 1:
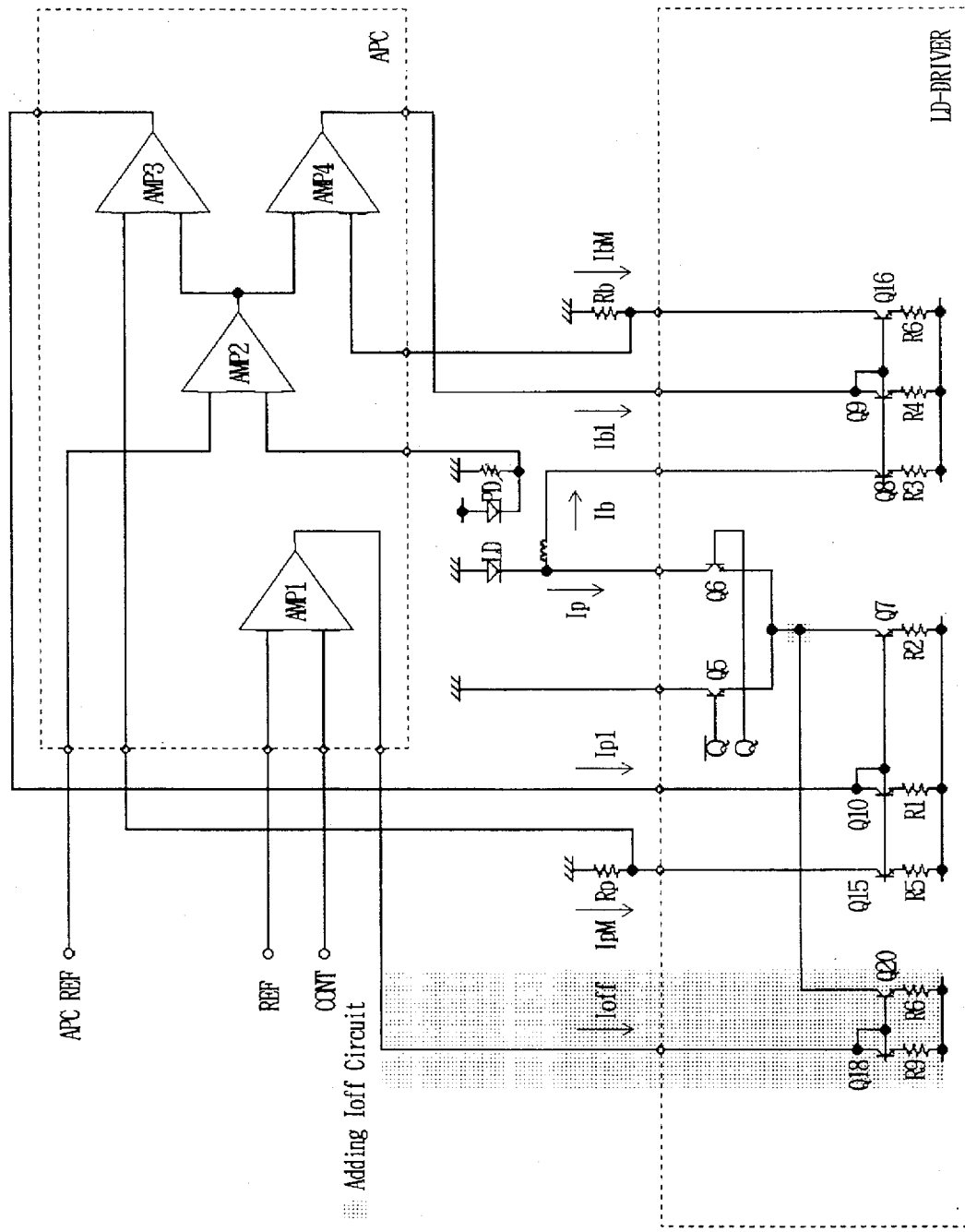
FIG. 1 is a circuitry diagram illustrating a first embodiment according to the present invention.

Throughout the following descriptions, the same reference numerals are used to denote and identify corresponding or identical components.

Figure 2:
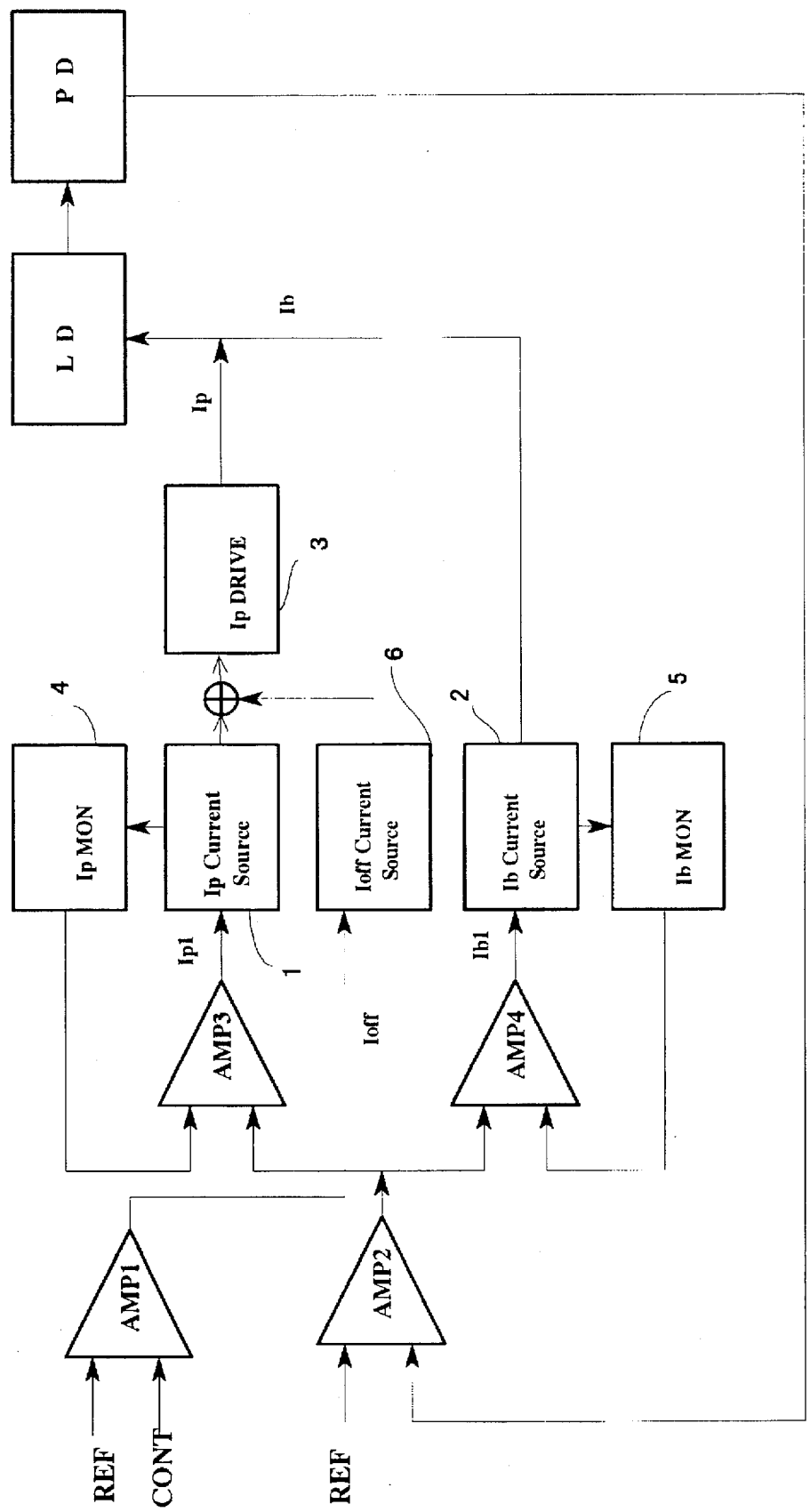
FIG. 2 shows a functional block diagram corresponding to FIG. 1.
Figure 13:
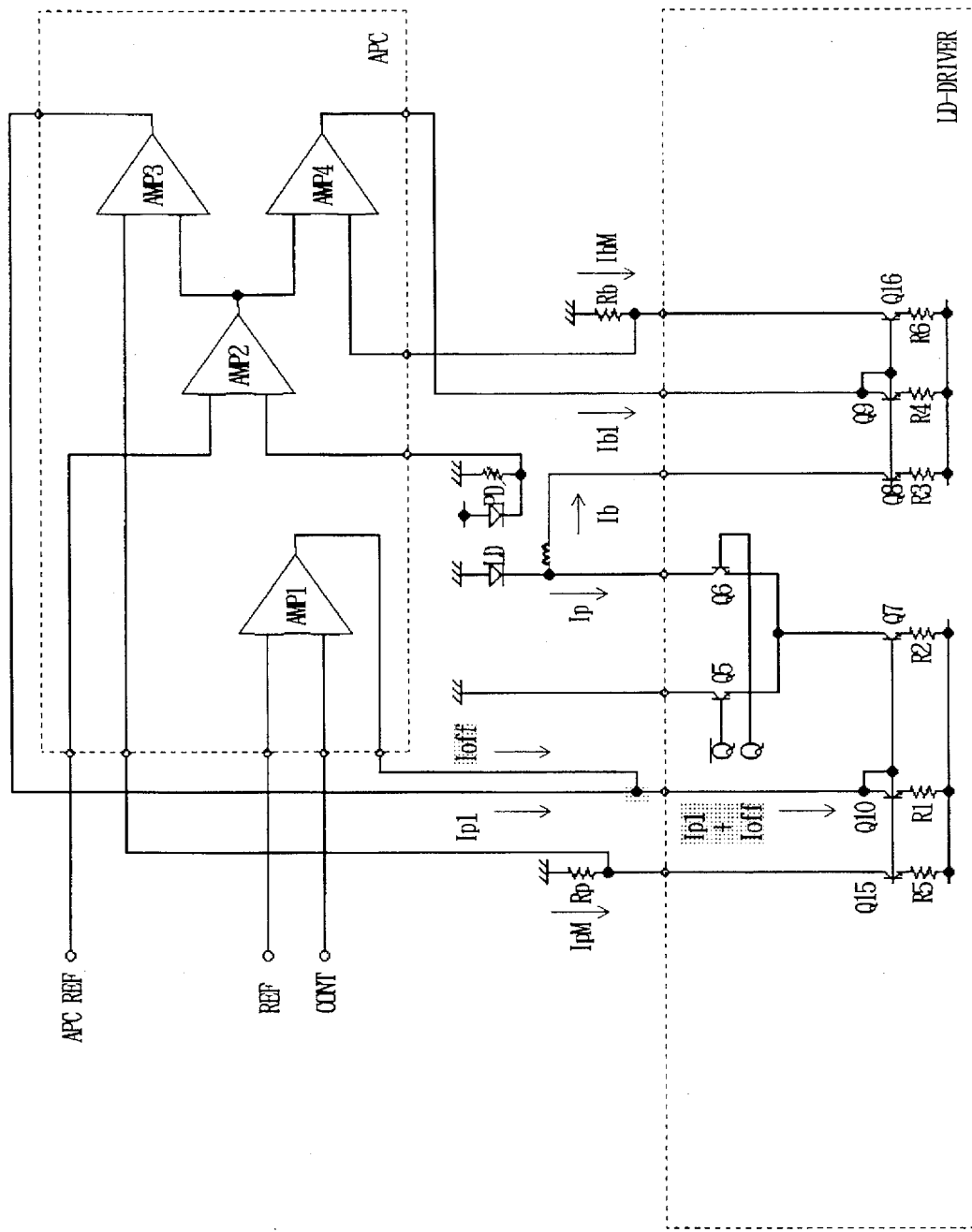
FIG. 13 is a diagram illustrating the conventional circuit.
Figure 14:
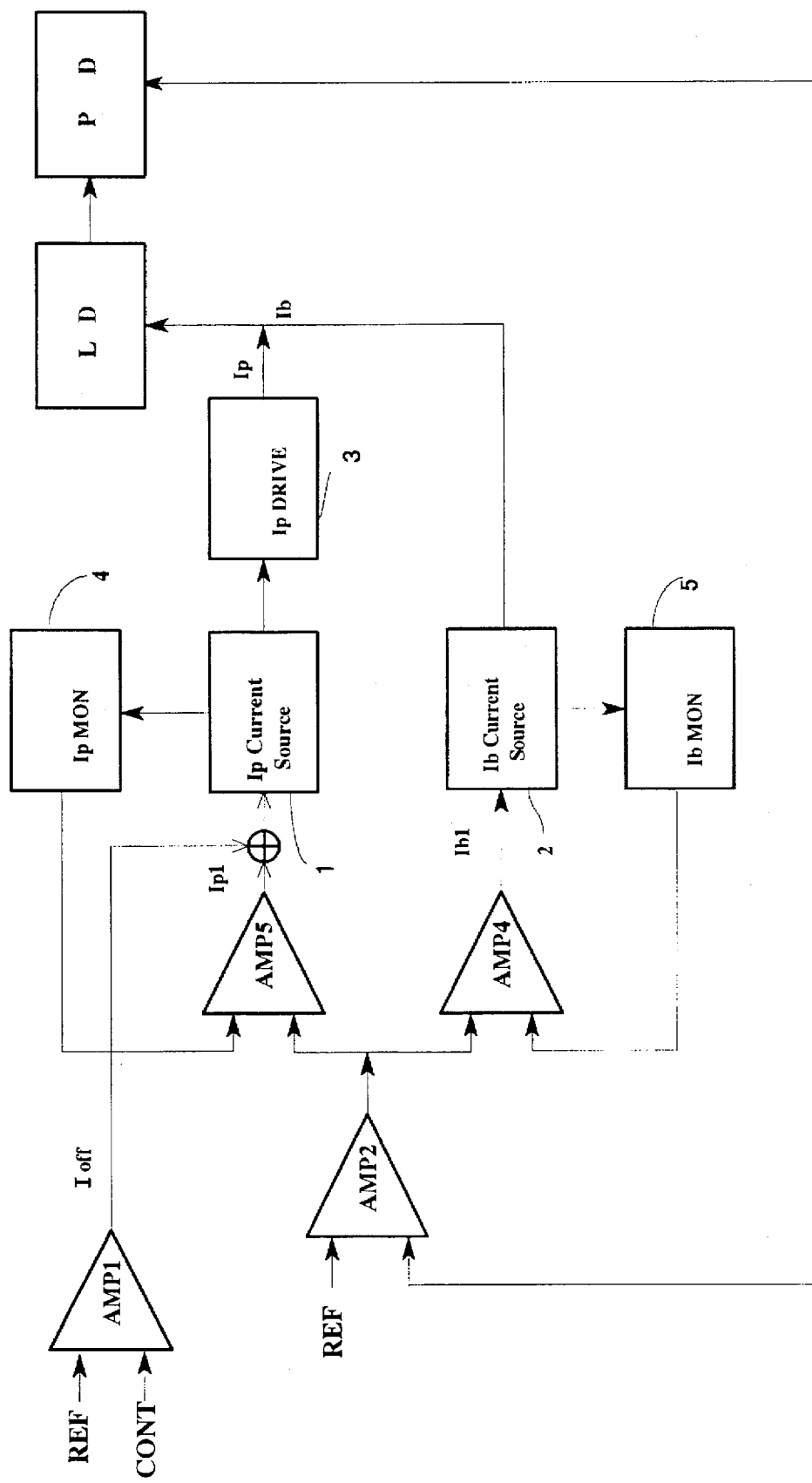
FIG. 14 shows a functional block diagram corresponding to FIG. 13.
Figure 15A:
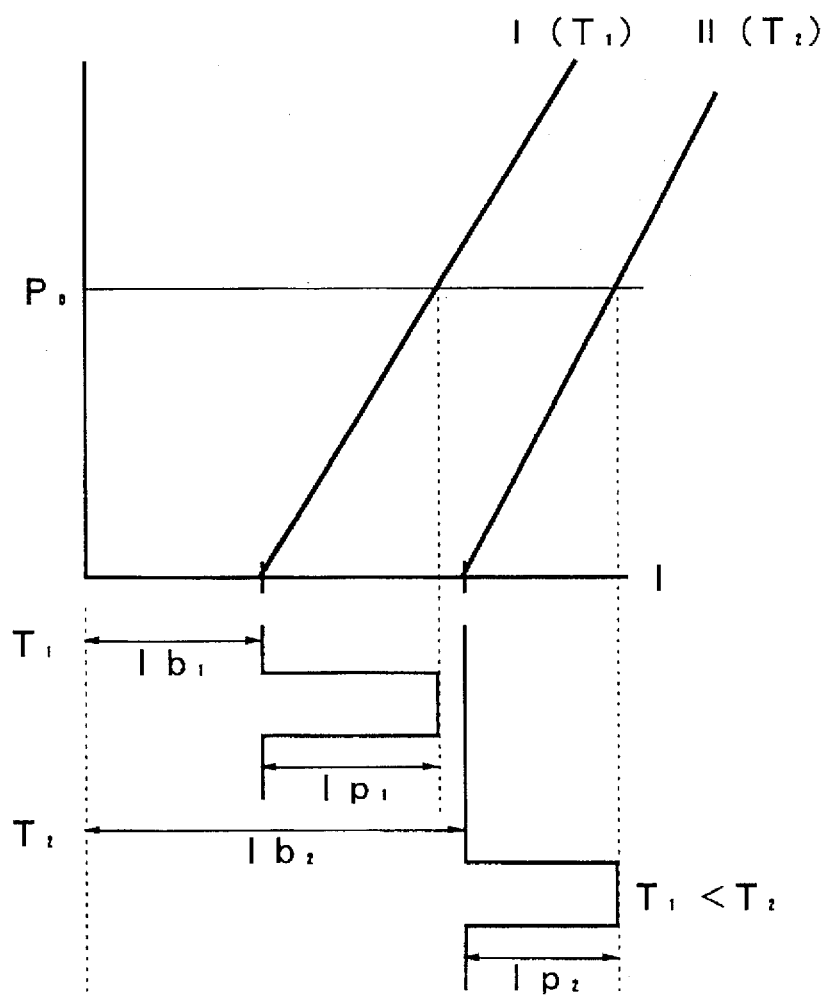
FIGS. 15a and 15B is an explanatory diagram of an optical output characteristic of a laser diode.
Figure 15B:
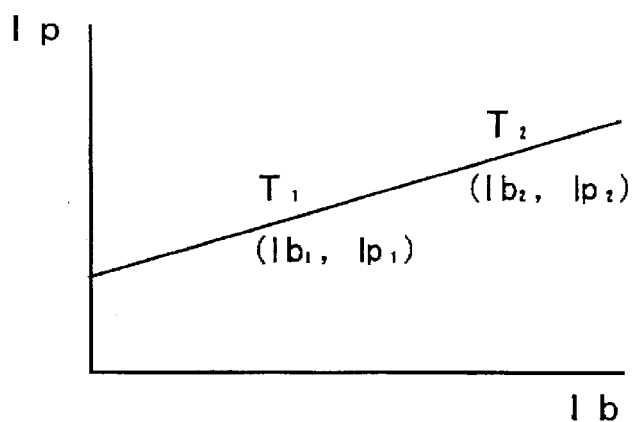

FIG. 1 illustrates a first embodiment, which is principle circuit structure according to the present invention to solve the problems on the circuit shown in FIG. 13. Further, FIG. 2 shows a functional block diagram corresponding to FIG. 1. When comparing the structure shown in FIG. 1 with the circuit structure shown in FIG. 13, the offset current Ioff is applied to the output side of the Ip current driver source 1 to prevent from applying into monitor current loop.

The offset current source circuit 6 shown in FIG. 2 is a mirrored circuit formed of transistors Q18 and Q20 and resistors R6 and R9 in FIG. 1. A collector of the transistor Q20 is connected to the common emitters of a differential pair of transistors Q5 and Q6. Accordingly, a current proportioned to the offset current Ioff sent from the differential amplifier AMP1 having a current source driver circuit is added to the signal driver current Ip1 at the common emitters.

Therefore, the offset current Ioff does not flow to the monitor resistor Rp. Accordingly, as shown in the equation (2), a component of Ioff is not included in the voltage Va of the equation (2). Further, when the signal driving current Ip1 is 0, i.e., when only the offset current Ioff is considered, the bias current Ib0 shown in FIG. 16A becomes 0, so that the real characteristic II can be corresponding to the targeted characteristic I.

Figure 16A:
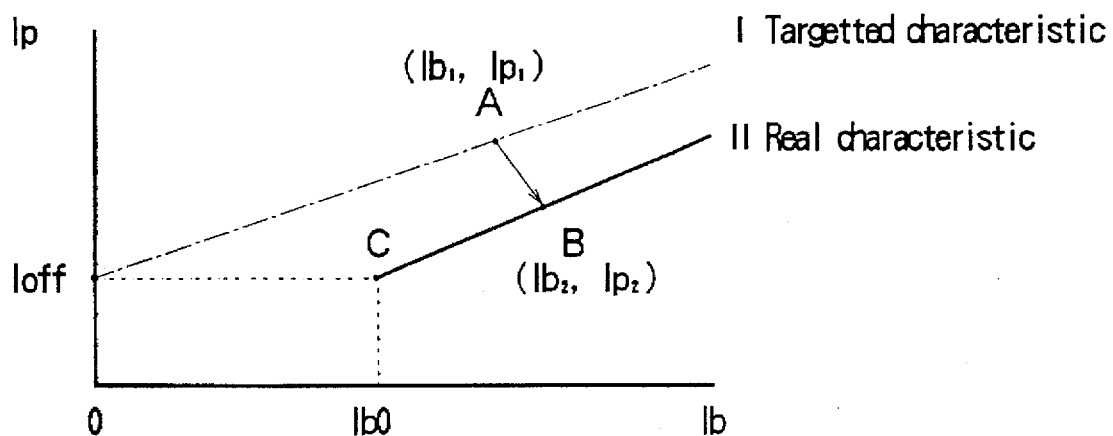
FIGS. 16A and 16B explains a problem of the circuit of FIG. 13.
Figure 16B:
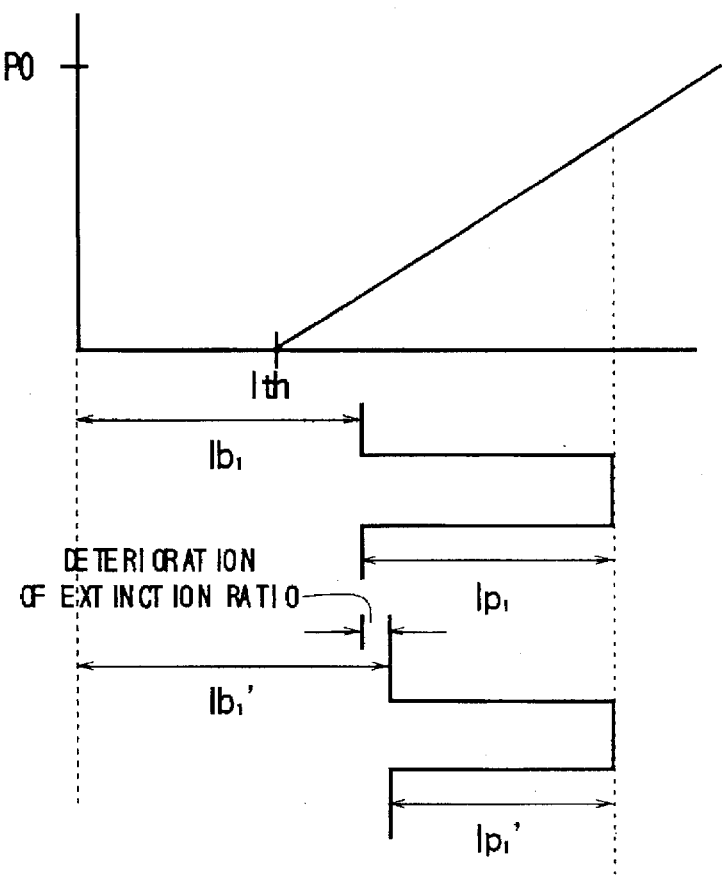

From this point, deterioration of extinction ratio, which is explained in FIG. 16B according to the embodiment shown in FIG. 1, can be solved.

Figure 3:
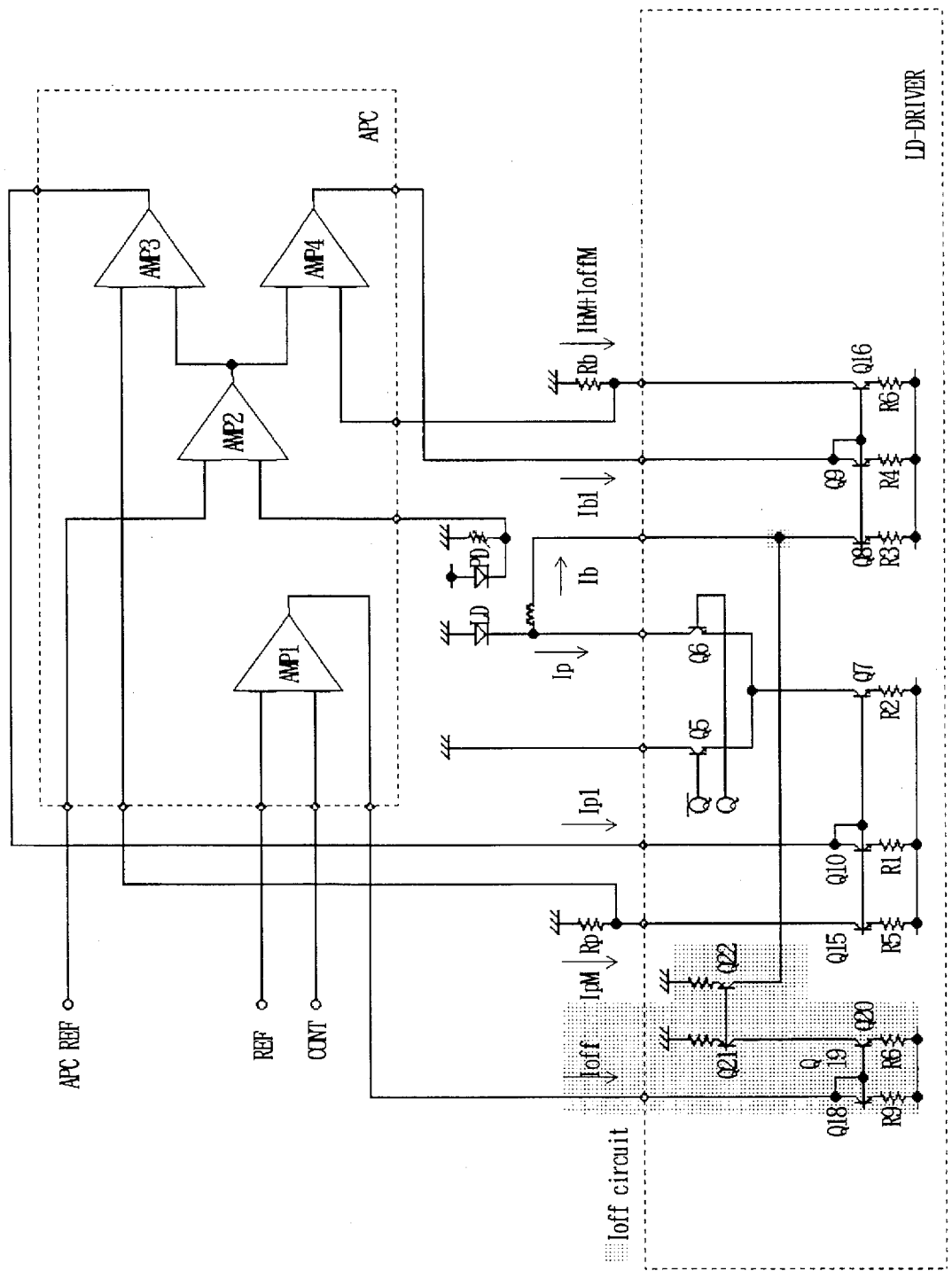
FIG. 3 is a circuitry diagram illustrating a second embodiment according to the present invention.
Figure 4:
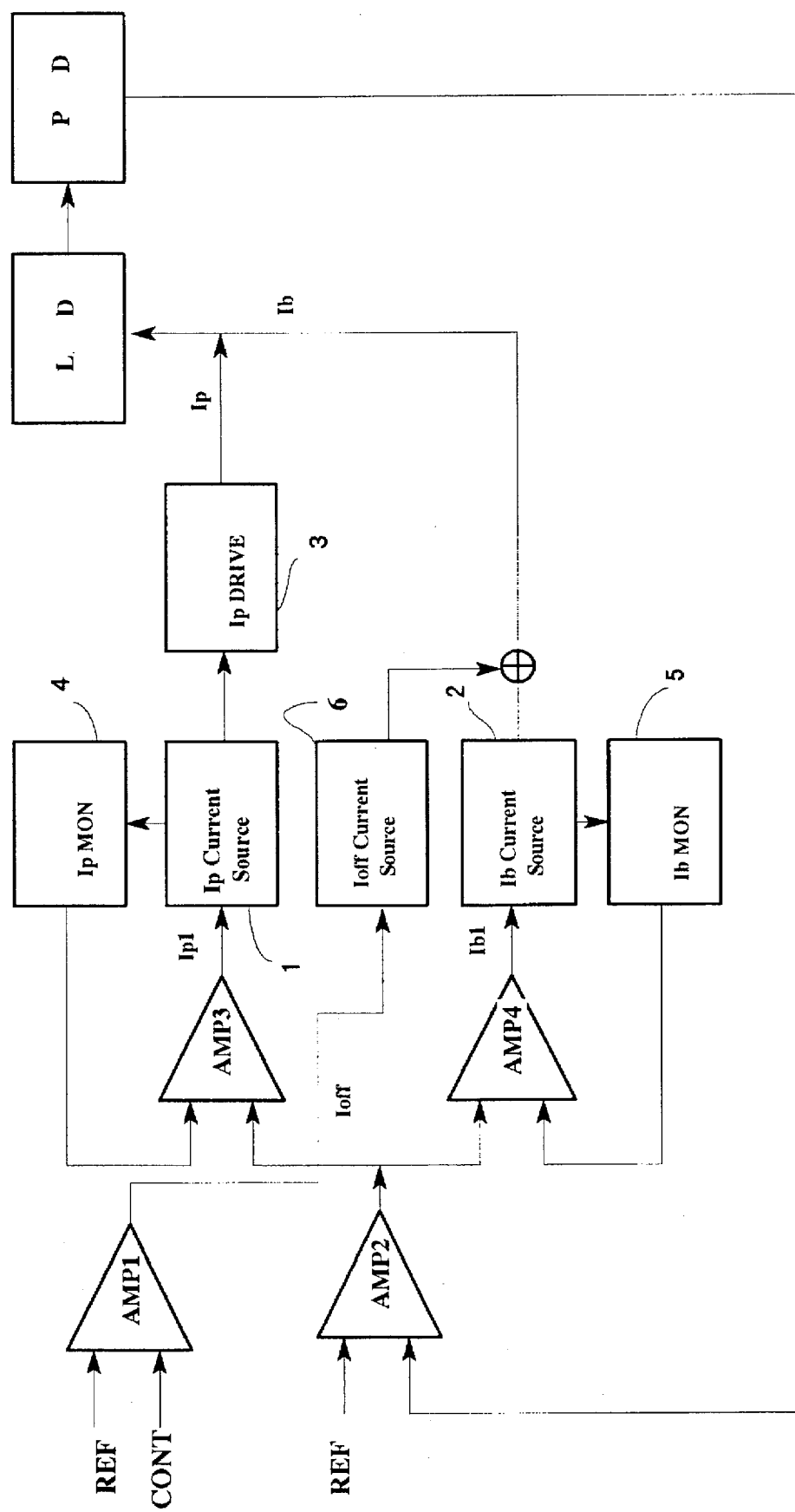
FIG. 4 shows a functional block diagram corresponding to FIG. 3.

FIG. 3 shows a second embodiment according to the present invention. FIG. 4 illustrates a functional block diagram corresponding to FIG. 3. When comparing the embodiment shown in FIG. 3 with the embodiment shown in FIG. 1, the offset current Ioff is added to the bias current Ib. It is apparent from the block diagram shown in FIG. 4 that the output of the offset current source circuit 6 is applied to the output of the bias current source circuit 2.

Then, the offset current source circuit 6 includes a mirrored circuit formed of transistors Q18 and Q20, and resistors R6 and R9, which is connected in tandem to a mirrored circuit formed of transistors Q21 and Q22, and an output of the mirrored circuit formed of transistors Q21 and Q22 is added to the bias current Ib.

Additionally, with the structure shown in FIG. 3, when Ip1 and Ib1 become zero, the offset current Ipoff is given so as to be IpM=Ipoff=IbM. Therefore, the operational function is the same as that of the embodiment shown in FIG. 1, in giving no deterioration to the extinction ratio.

Figure 5:
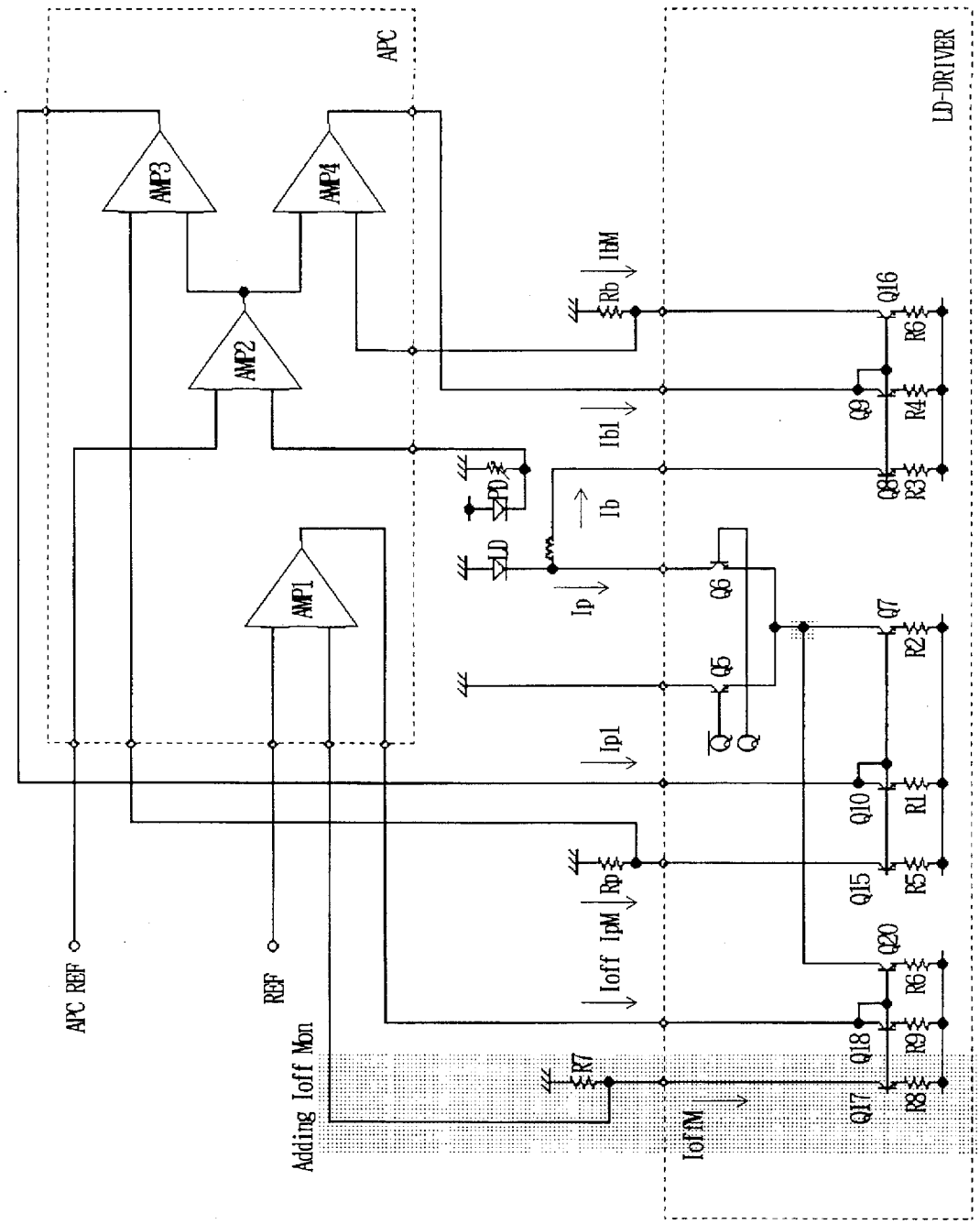
FIG. 5 is a circuitry diagram illustrating a third embodiment according to the present invention.
Figure 6:
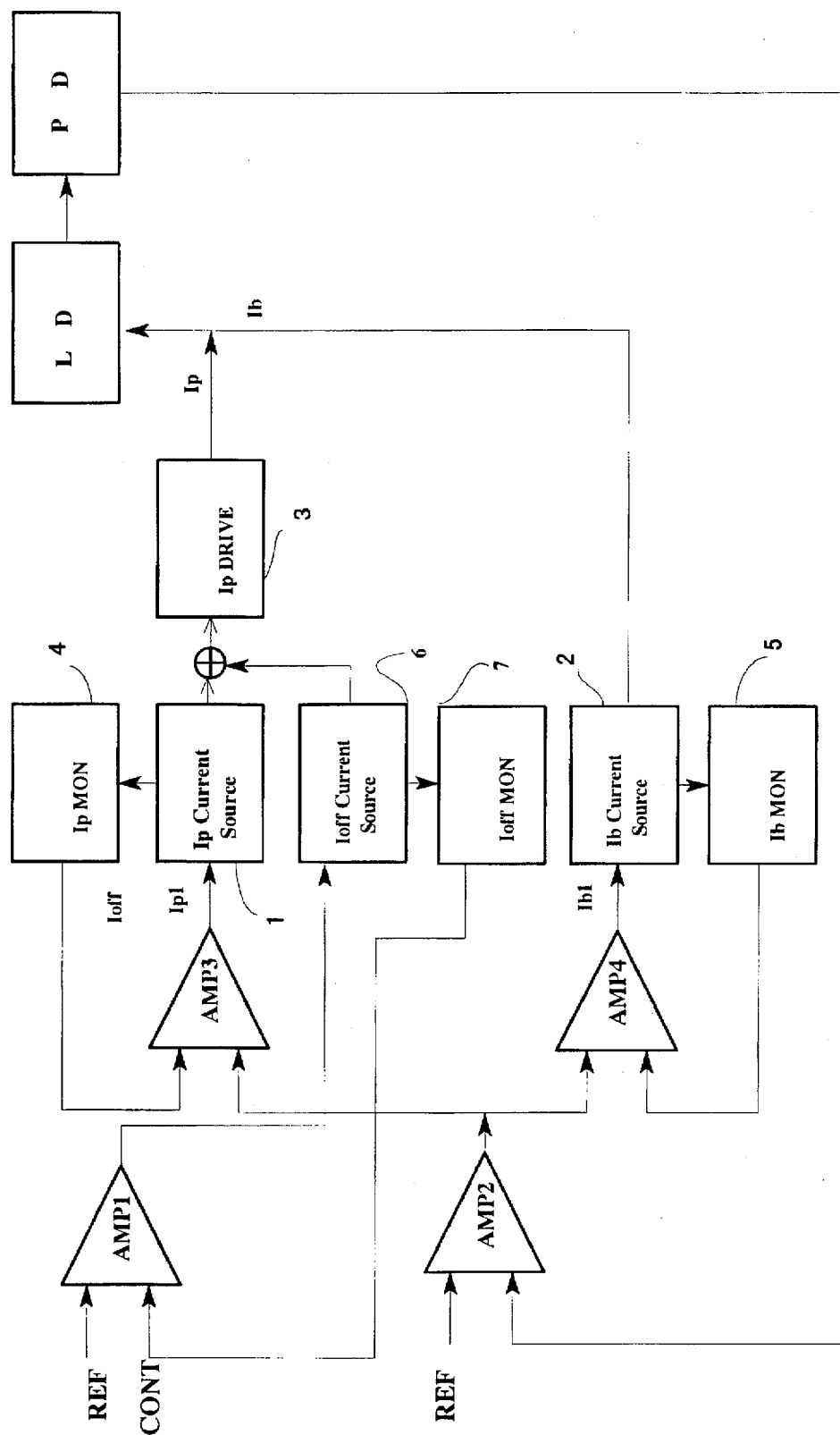
FIG. 6 shows a functional block diagram corresponding to FIG. 5.

FIG. 5 is a third embodiment according to the present invention. FIG. 6 illustrates a functional block diagram corresponding to FIG. 5. In the embodiment shown in FIG. 5, a monitor circuit 7 is provided to monitor the offset current Ioff. The output of the monitor circuit 7 is fed back to the differential amplifier AMP1 having the current source driver circuit in order to stabilize the offset current Ioff.

The monitor circuit 7 is composed of a mirrored circuit having a transistor Q17 and a resistor R8 and a monitor resistor R7. A voltage generated on the monitor resistor R7 according to the monitor current IoffM, which is proportioned to the offset current Ioff, is inputted to the differential amplifier AMP1 having the current source driver circuit.

With this structure, the problem on the conventional circuit shown in FIG. 13 can be solved. The operational function is the same as that of the embodiment shown in FIG. 1.

Figure 7:
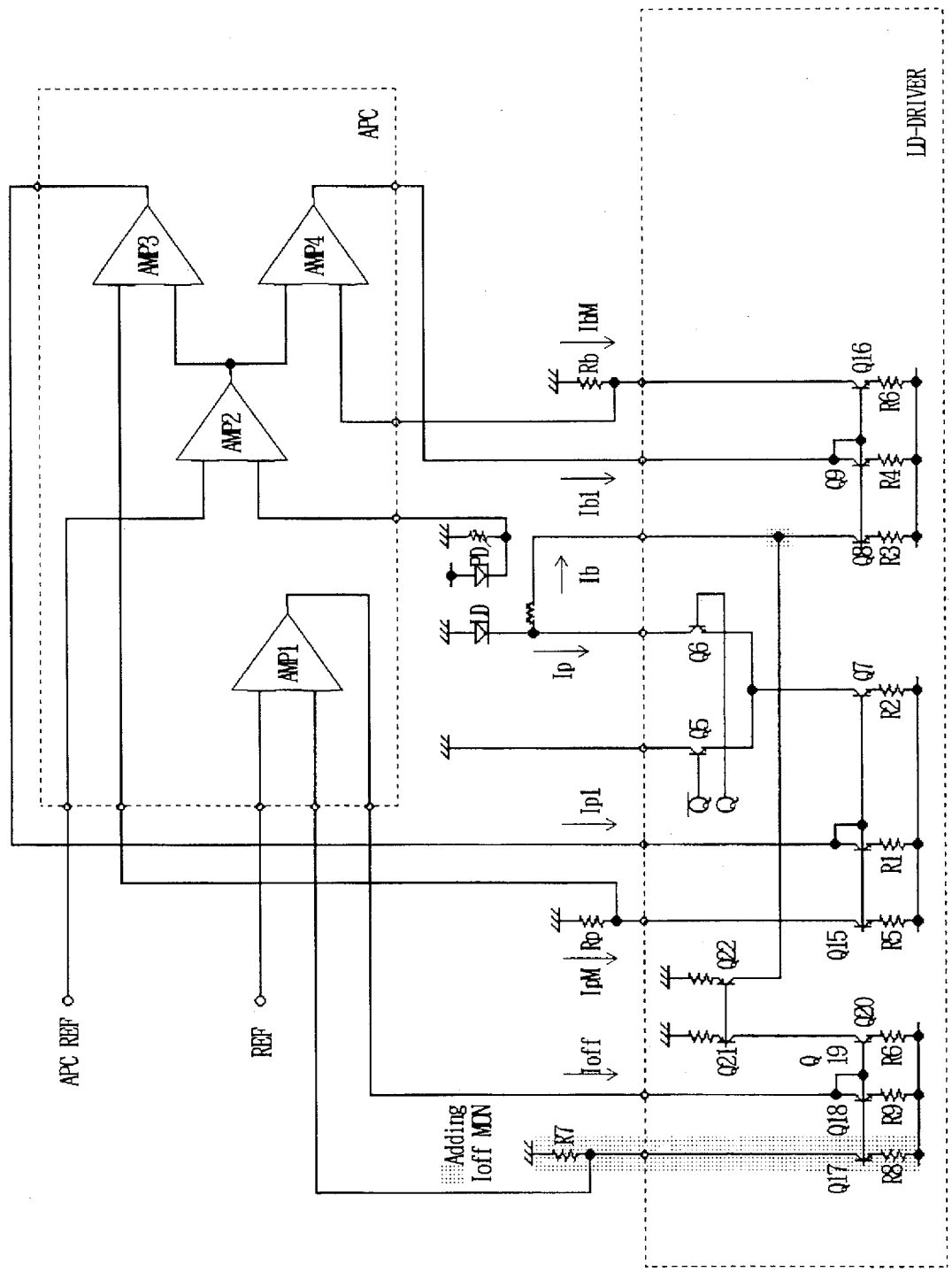
FIG. 7 is a circuitry diagram illustrating a fourth embodiment according to the present invention.
Figure 8:
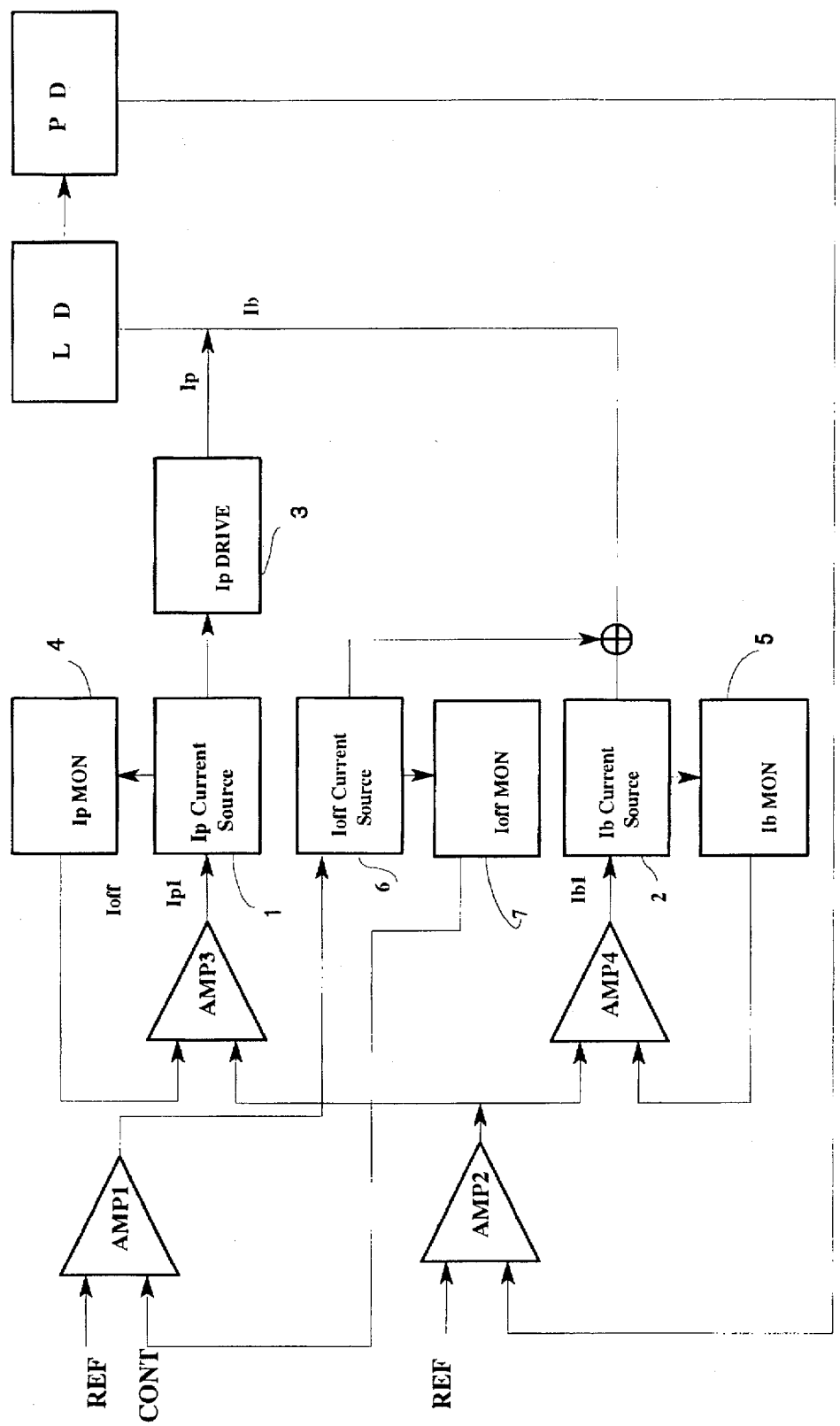
FIG. 8 shows a functional block diagram corresponding to FIG. 7.

FIG. 7 is a fourth embodiment according to the present invention. FIG. 8 illustrates a functional block diagram corresponding to FIG. 7.

The embodiment shown in FIG. 7 has a structure like a circuitry structure combined the embodiment shown in FIG. 3 with the embodiment shown in FIG. 5. That is, the offset current Ioff is applied to the bias current, in the same manner as the embodiment shown in FIG. 3. Further, a monitor circuit, which monitors the offset current Ioff is also provided to this embodiment, in the same manner as the embodiment shown in FIG. 5.

Accordingly, extinction ratio can be prevented from deterioration. That causes effectiveness of stabilization of the offset current Ioff, in the same manner as the embodiment shown in FIG. 5.

Figure 9:
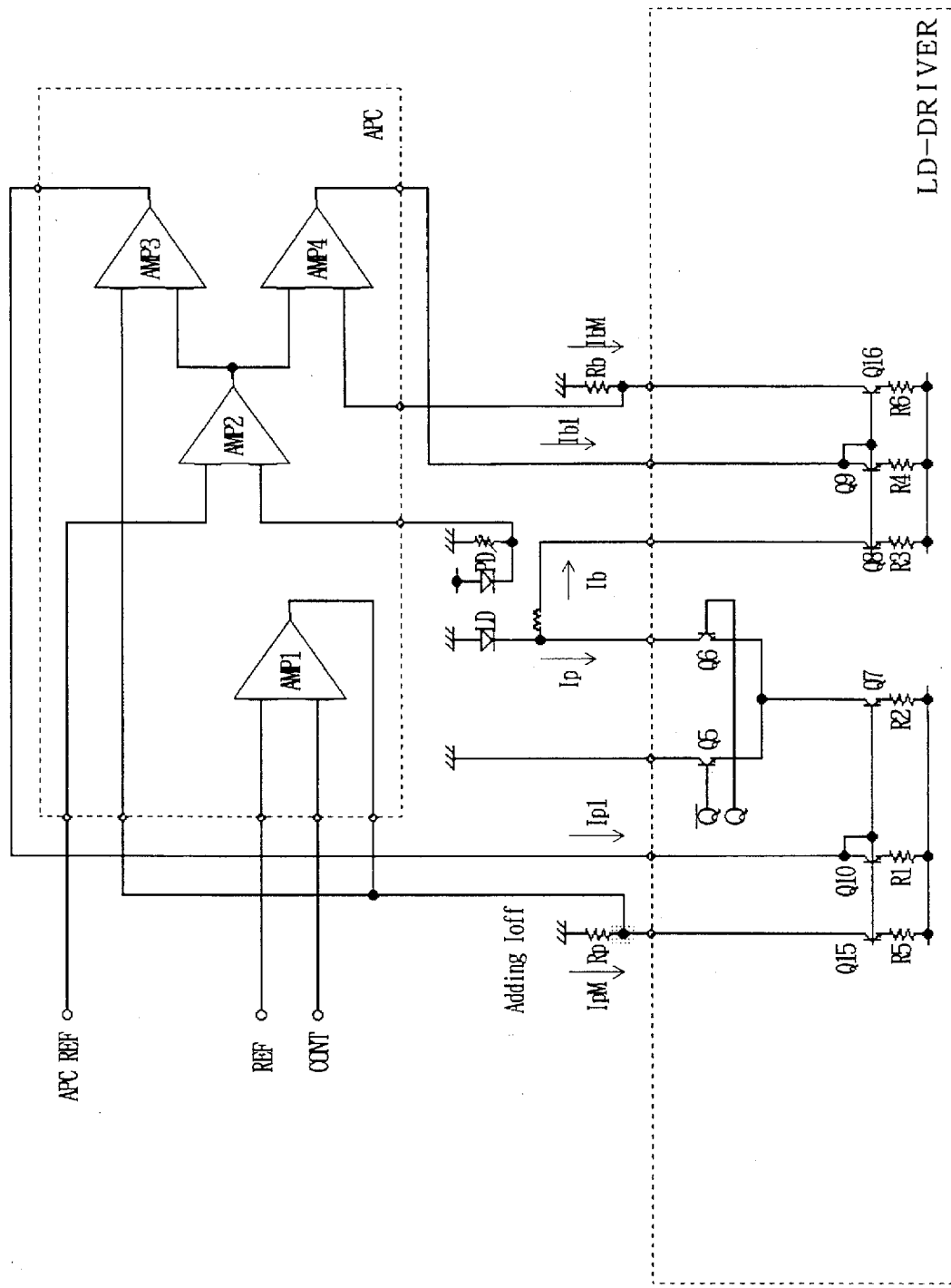
FIG. 9 is a circuitry diagram illustrating a fifth embodiment according to the present invention.
Figure 10:
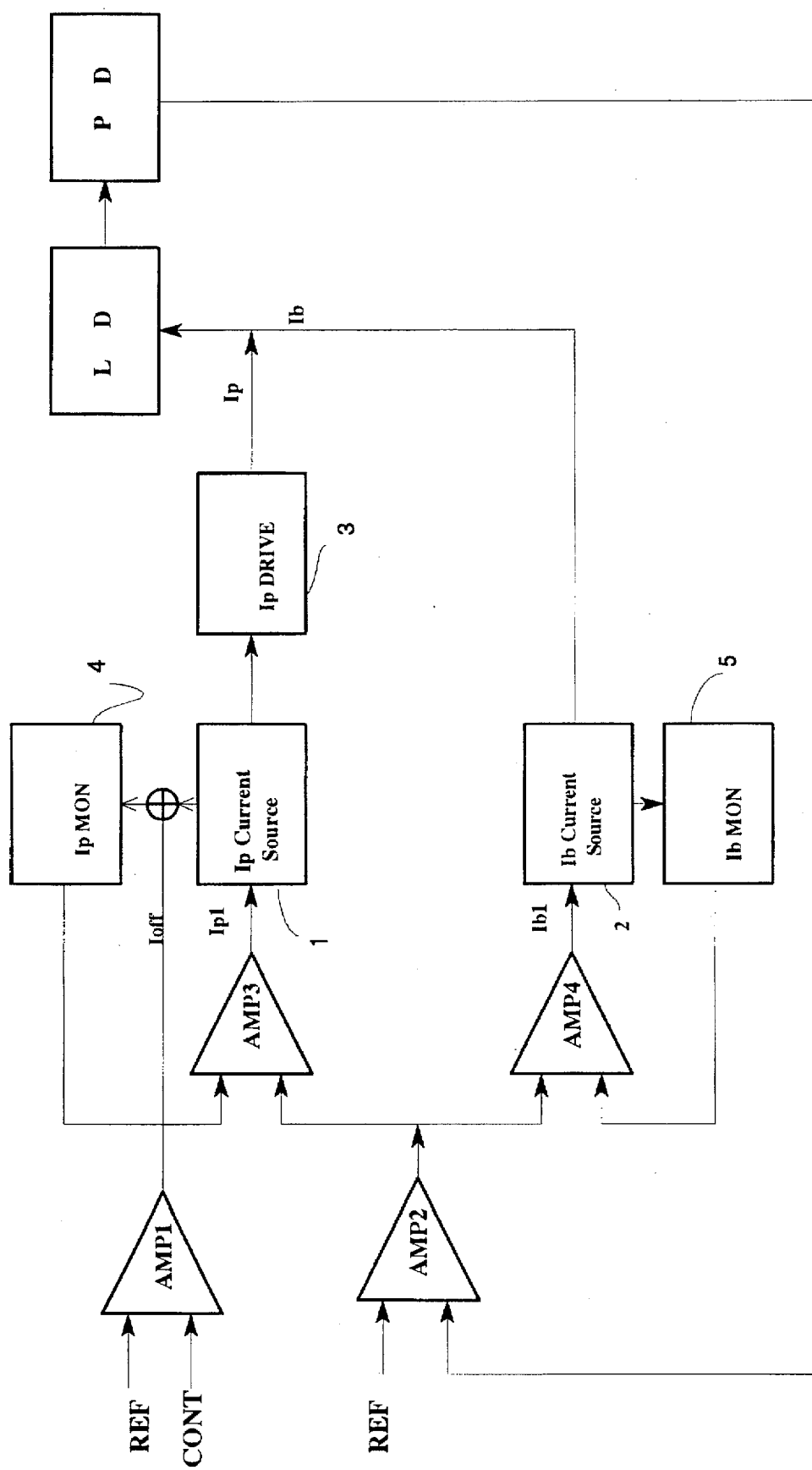
FIG. 10 shows a functional block diagram corresponding to FIG. 9.

FIG. 9 is a fifth embodiment according to the present invention. FIG. 10 illustrates a functional block diagram corresponding to FIG. 9. In the embodiment shown in FIG. 9, the offset current Ioff is added to monitor current flowing to the monitor resistor Rp.

That is, as it is the mirrored circuit, current proportioned to the signal driving current (Ip1+Ioff) is flowing to the collector of the transistor Q15 (IpM1+IoffM). However, only IpM1 is flowing to the monitor resistor Rp, so that the current ratio keeps the relationship of IpM1/IbM, i.e., a. Further, when the relation is IpM1=IbM=0 mA, IbM becomes 0 mA. In the embodiment shown in FIG. 9, only Ioff is flowing to a collector of the transistor Q10, the problem of deterioration of extinction ratio, which is caused by shifting a characteristic to the characteristic II explained in FIG. 16A, will not be generated.

Further, in the embodiment shown in FIG. 9, on comparison with each of the above-described embodiments, a mirrored circuit for the offset current Ioff can be abbreviated for simplicity.

Figure 11:
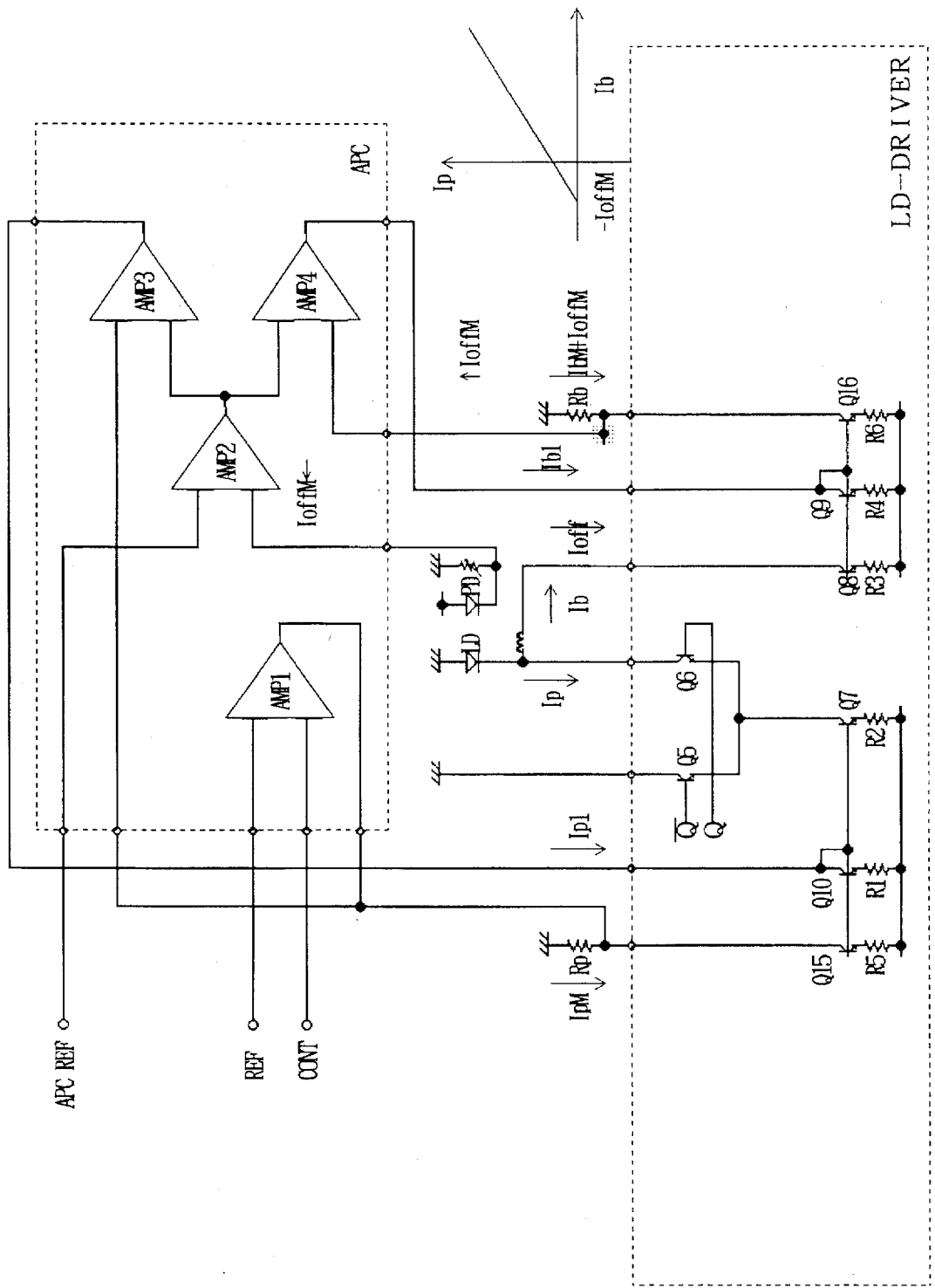
FIG. 11 is a circuitry diagram illustrating a sixth embodiment according to the present invention.

FIG. 11 shows a structure, in which a mirrored circuit to the offset current Ioff is removed, according to the same concept of the embodiment shown in FIG. 9. FIG. 12 illustrates a functional block diagram corresponding to FIG. 11. A different point from the embodiment shown in FIG. 9 is to form the circuit so as to subtract the offset current Ioff from the bias driving current Ib1.

In FIG. 11, current proportioned to the bias driving current Ib1 is flowing to the transistor Q16 of the mirrored circuit. Meanwhile, current IbM1 proportioned to the bias driving current Ib1 flowing to the transistor Q16 and the offset current IoffM, which flows in the direction for being absorbed to the comparison amplifier AMP1, for flowing to the monitor resistor Rb.

Accordingly, when considering in FIG. 16, on the condition of the bias driver current Ib1=0, the offset current Ioff in the direction to be absorbed to the comparison amplifier AMP1 is flowing to the monitor resistor Rb.

This means that the real characteristic is given by extending or shifting the characteristic I shown with a dotted line in a negative direction for the offset current Ioff in FIG. 16A. Accordingly, the characteristic of the circuit shown in FIG. 11 is on the targeted characteristic I. Therefore, a problem caused by changing to the characteristic II in FIG. 16A is not generated.

As explained above in accompanying with the embodiments, in a control circuit for supplying a laser driving current to a laser diode, which is provided with a LD current monitoring circuit to control the ratio of a bias current Ib to a LD driving current Ip to be constant, the offset current Ioff may be added to control the LD current with better accuracy according to the present invention.

Therefore, it is possible to control LD current without employing a temperature control element, such as Peltier element. Accordingly, it becomes possible to miniature the device and reduce consumptive power.

In addition, the above-explained examples are to explain the present invention, and may not restrict the scope of the protection by the present invention, and may not restrict the scope of the protection by the present invention. The scope of the protection is determined by the attached claims and the equivalent of the claimed invention is also within the scope of the protection by the present invention.

What is claimed is:

1. A control circuit for supplying a driving current to a laser diode comprising:

a laser diode;

a photo diode for receiving a part of an optical output emitted from the laser diode and outputting an electric signal corresponding to a level of the optical output;

a first current supplying circuit for supplying a signal driving current to the laser diode;

a second current supplying circuit for supplying a bias current of the laser diode;

a first monitor circuit for monitoring a size of the signal driving current supplied by the first current supplying circuit;

a second monitor circuit for monitoring a size of the bias current supplied by the second current supplying circuit;

a first feed-back loop for controlling the signal driving current supplied from the first current supplying circuit by the output of the first monitor circuit, as a reference of the electric signal outputted from the photo diode corresponding to the level of the optical output emitted from the laser diode;

a second feed-back loop for controlling the bias current supplied from the second current supplying circuit by the output of the second monitor circuit, as said reference of the signal outputted from the photo diode corresponding to the level of the optical output emitted form the laser diode; and an adder circuit for adding an offset current to the signal driving current supplied from the first current supplying circuit on the outside of the first feed-back loop.

2. The control circuit for supplying a driving current of a laser diode according to claim 1, further comprising:

an offset current monitor circuit for monitoring the offset current and generating a monitored offset current corresponding to a level of the offset current; and a feed-back circuit for receiving and supplying the monitored offset current to the adder circuit so as to add the monitored offset current to the offset current.

3. A control circuit for supplying a driving current to a laser diode comprising:

a laser diode;

a photo diode for receiving a part of an optical output emitted from the laser diode and outputting an electrical signal corresponding to a level of the optical output;

a first current supplying circuit for supplying a signal driving current to the laser diode;

a second current supplying circuit for supplying a bias current to the laser diode;

a first monitor circuit for monitoring a size of the signal driving current supplied by the first current supplying circuit;

a second monitor circuit for monitoring a size of the bias current supplied by the second current supplying circuit;

a first feed-back loop for controlling the signal driving current supplied from the first current supplying circuit by the output of the first monitor circuit, as a reference of the electric signal outputted from the photo diode corresponding to the level of the optical output emitted from the laser diode;

a second feed-back loop for controlling the bias current supplied from the second current supplying circuit by the output of the second monitor circuit, as said reference of the signal outputted from the photo diode corresponding to the level of the optical output emitted from the laser diode; and an adder circuit for adding an offset current to the bias current supplied from the second current supplying circuit on the outside of the second feed-back loop.

4. The control circuit for supplying a driving current of a laser diode according to claim 3, further comprising:

an offset current monitor circuit for monitoring the offset current and generating a monitored offset current corresponding to a level of the offset current; and a feed-back circuit for receiving and supplying the monitored offset current to the adder circuit so as to add the monitored offset current to the offset current.

5. A control circuit for supplying a driving current to a laser diode comprising:

a laser diode;

a photo diode for receiving a part of an optical output emitted from the laser diode and outputting an electric signal corresponding to a level of the optical output;

a first current supplying circuit for supplying a signal driving current to the laser diode;

a second current supplying circuit for supplying a bias current to the laser diode;

a first monitor circuit for monitoring a size of the signal driving current supplied by the first current supplying circuit;

a second monitor circuit for monitoring a size of the bias current supplied by the second current supplying circuit;

a first feed-back loop for controlling the signal driving current supplied from the first current supplying circuit by the output of the first monitor circuit, as a reference of the electric signal outputted from the photo diode corresponding to the level of the optical output emitted from the laser diode;

a second feed-back loop for controlling the bias current supplied from the second current supplying circuit by the output of the second monitor circuit, as said reference of the signal outputted from the photo diode corresponding to the level of the optical output emitted from the laser diode; and an adder circuit for adding an offset current to the output of the first monitor circuit in said first feed-back circuit.

6. A control circuit for supplying a driving current to a laser diode comprising:

a laser diode;

a photo diode for receiving a part of an optical output emitted from the laser diode and outputting an electric signal corresponding to a level of the optical output;

a first current supplying circuit for supplying a signal driving current to the laser diode;

a second current supplying circuit for supplying a bias current to the laser diode;

a first monitor circuit for monitoring a size of the signal driving current supplied by the first current supplying circuit;

a second monitor circuit for monitoring a size of the bias current supplied by the second current supplying circuit;

a first feed-back loop for controlling the signal driving current supplied from the first current supplying circuit by the output of the first monitor circuit, as a reference of the electric signal outputted from the photo diode corresponding to the level of the optical output emitted from the laser diode;

a second feed-back loop for controlling the bias current supplied from the second current supplying circuit by the output of the second monitor circuit, as said reference of the signal outputted from the photo diode corresponding to the level of the optical output emitted from the laser diode; and a subtract circuit for subtracting an offset current from the output of the second monitor circuit in the second feed back loop.

* * * * *